(12) United States Patent
Hunter et al.

(10) Patent No.: US 11,933,859 B2
(45) Date of Patent: Mar. 19, 2024

(54) MULTI-CELL BATTERY FAULT INDICATOR

(71) Applicant: TEXAS INSTRUMENTS INCORPORATED, Dallas, TX (US)

(72) Inventors: Bradford Lawrence Hunter, Spicewood, TX (US); Eric Frank Estes, Rowlett, TX (US); Wallace Edward Matthews, Austin, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 442 days.

(21) Appl. No.: 17/363,626

(22) Filed: Jun. 30, 2021

(65) Prior Publication Data
US 2023/0003810 A1    Jan. 5, 2023

(51) Int. Cl.
*G01R 31/396* (2019.01)
*G01R 31/3835* (2019.01)
*G01R 31/52* (2020.01)

(52) U.S. Cl.
CPC ....... *G01R 31/396* (2019.01); *G01R 31/3835* (2019.01); *G01R 31/52* (2020.01)

(58) Field of Classification Search
CPC .. G01R 31/396; G01R 31/3835; G01R 31/52; G01R 31/385; H01M 10/482; H01M 10/48
See application file for complete search history.

(56) References Cited

U.S. PATENT DOCUMENTS

| | | | |
|---|---|---|---|
| 10,451,675 B2* | 10/2019 | Honkote | G06F 1/305 |
| 2012/0112785 A1* | 5/2012 | Mizoguchi | G01R 35/00 |
| | | | 324/762.08 |
| 2016/0084914 A1* | 3/2016 | Bernardon | H01M 10/482 |
| | | | 324/426 |

* cited by examiner

*Primary Examiner* — Nghia M Doan
(74) *Attorney, Agent, or Firm* — Ray A. King; Frank D. Cimino

(57) ABSTRACT

In some examples, apparatus comprises a multiplexer (MUX) adapted to be coupled to a set of battery cells and configured to provide a voltage of a different battery cell in the set of battery cells based on a MUX control signal. Apparatus comprises a comparator coupled to the MUX and configured to compare a MUX output signal to a threshold voltage to provide a comparator output signal. Apparatus comprises a digital control circuit configured to provide the MUX control signal to the MUX, to store the comparator output signal, and to use a logic AND gate to provide an AND gate output signal based on the stored comparator output signal.

16 Claims, 5 Drawing Sheets

MULTI-CELL BATTERY FAULT INDICATOR

BACKGROUND

Various electronic devices include battery cells that are useful to power the electronic devices. Such battery cells enable the electronic devices to be used in a portable manner. For example, one or more battery cells may provide power to a laptop computer, thereby enabling the laptop computer to operate without being connected to mains power.

SUMMARY

In some examples, apparatus comprises a multiplexer (MUX) adapted to be coupled to a set of battery cells and configured to provide a voltage of a different battery cell in the set of battery cells based on a MUX control signal. Apparatus comprises a comparator coupled to the MUX and configured to compare a MUX output signal to a threshold voltage to provide a comparator output signal. Apparatus comprises a digital control circuit configured to provide the MUX control signal to the MUX, to store the comparator output signal, and to use a logic AND gate to provide an AND gate output signal based on the stored comparator output signal.

DETAILED DESCRIPTION

Figure 1:
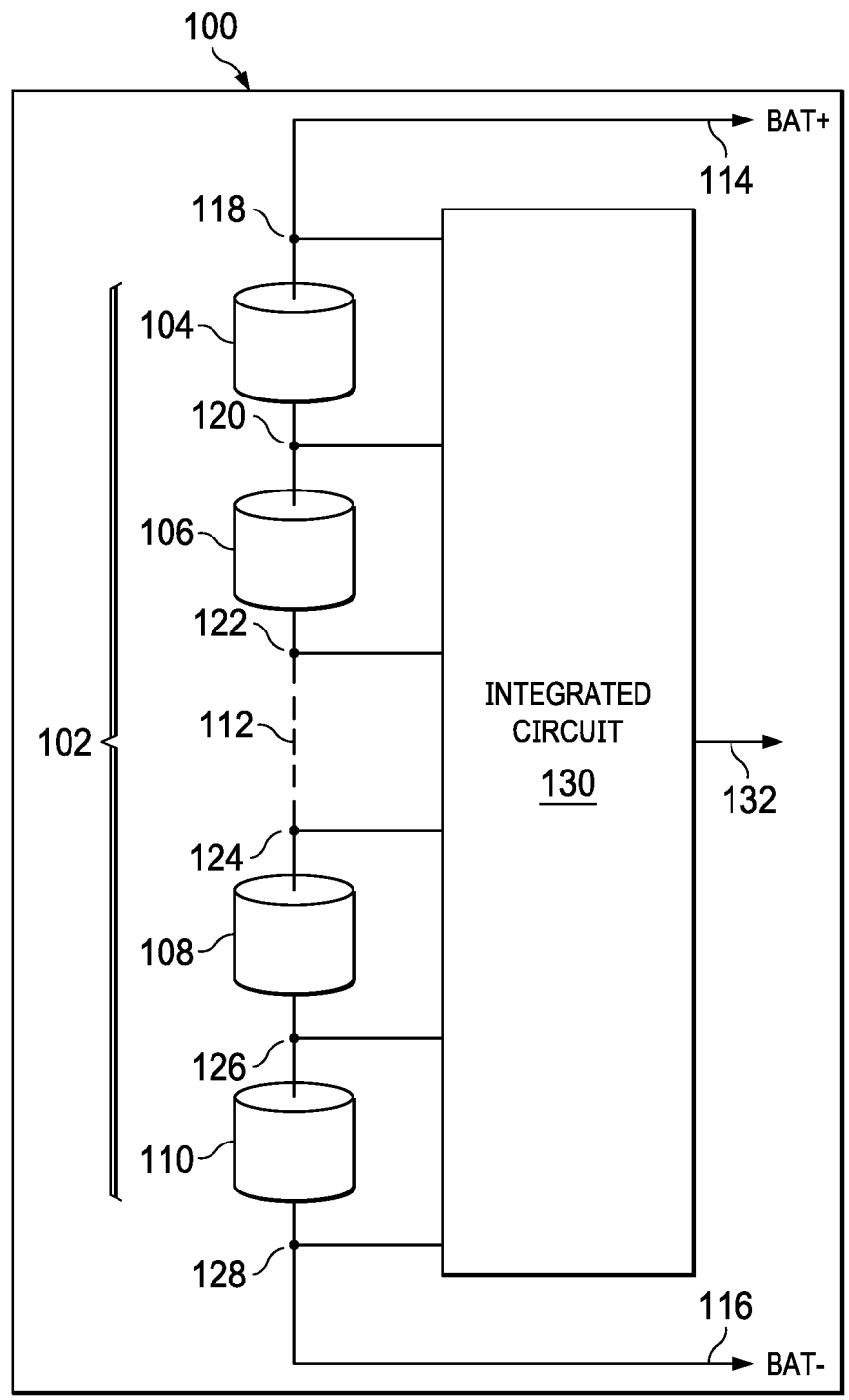
FIG. 1 is a block diagram of an electronic system including a multi-cell battery fault indicator integrated circuit (IC) and a set of battery cells, in accordance with examples.

Electronic system battery cells sometimes may operate improperly. Such improper operation is called a fault condition. For example, a common fault condition arises responsive to a battery cell providing an excessively high voltage that exceeds a threshold voltage, which is called an overvoltage fault condition. Many electronic systems contain safety mechanisms to detect the occurrence of a fault condition and to take remedial action responsive to occurrence of the fault condition. For example, responsive to the occurrence of a fault condition, an electronic system safety mechanism may issue an alert signal. Such a safety mechanism may take the form of an integrated circuit (IC) that is coupled to the battery cells in the electronic system so the IC may monitor the battery cells and take remedial action as may be appropriate.

The IC should be tested prior to implementation in an electronic system to verify whether the IC responds appropriately to input voltages that exceed a threshold voltage. Current techniques for testing such ICs are expensive and time-consuming at least in part because they involve testing individual components of the IC against the threshold, one at a time. This inefficiency is exacerbated if the IC is to be tested against multiple different threshold voltages.

Described below are various examples of a multi-cell battery fault indicator IC that resolves the challenges described above. The IC includes a first comparator having a first comparator output, a pair of first comparator battery cell inputs, and a first comparator threshold input. The pair of first comparator battery cell inputs is adapted to be coupled in parallel to a first battery cell. The IC includes a second comparator having a second comparator output, a pair of second comparator battery cell inputs, and a second comparator threshold input. The pair of second comparator battery cell inputs is adapted to be coupled in parallel to a second battery cell. The IC includes a logical AND gate having an AND gate output and first and second AND gate inputs. The first AND gate input is coupled to the first comparator output and the second AND gate input is coupled to the second comparator output. The IC includes a logical OR gate having an OR gate output and first and second OR gate inputs. The first OR gate input is coupled to the first comparator output and the second OR gate input is coupled to the second comparator output.

As the IC is being tested, the first and second battery cells are forced into a fault condition that causes the voltages provided by the first and second battery cells to exceed a threshold voltage. The threshold voltage is provided to the first and second comparator threshold inputs. The AND gate output is monitored. If the AND gate output provides a HIGH signal, the IC is operating properly, because the first and second comparators are properly recognizing that the voltages provided by the first and second battery cells exceed the threshold voltage provided at the first and second comparator threshold inputs. A HIGH signal provided by the AND gate output also indicates that the connections between the first and second comparators and the AND gate are operating properly. If the AND gate output provides a LOW signal, the IC is defective and can be repaired or discarded. Because an AND gate does not provide a HIGH signal unless all inputs to the AND gate are HIGH, the AND gate in the IC facilitates the rapid and efficient bulk testing of large numbers of comparators. Similarly, because the same threshold voltage is provided to the various comparator threshold inputs, the proper operation of the IC may be rapidly and efficiently verified against multiple threshold voltages.

As described, the IC includes a logical OR gate. The operation of the OR gate may be tested by forcing at least one of the first and second battery cells into a fault condition and verifying that the OR gate provides a HIGH output.

After the IC has been tested and its proper operation has been verified, the IC may be implemented in an electronic system. The electronic system may be configured to monitor the OR gate output of the IC and to disregard the AND gate output of the IC. The OR gate output is monitored because it will provide a HIGH signal if even one of the battery cells is in a fault condition, which is a useful feature for mitigating the consequences of fault conditions. Conversely, the AND gate output is disregarded because it will provide a HIGH signal only if all of the battery cells are in fault conditions, which is not a useful feature for mitigating the consequences of fault conditions. A HIGH signal provided by the OR gate output indicates a fault condition among one or more of the battery cells in the electronic system. The electronic system may take corrective action responsive to such an OR gate output.

FIG. 1 is a block diagram of an electronic system 100, in accordance with examples. In examples, the electronic system 100 is a personal electronic system (e.g., smartphones, laptop computers, desktop computers, tablets, notebooks, artificial intelligence assistants), electronic appliance (e.g., refrigerators, microwave ovens, toaster ovens, dishwashers), networking or enterprise-level electronic system (e.g., servers, routers, modems, mainframe computers, wireless access points), automobile or aviation system (e.g., control panels, entertainment devices, navigation devices, power electronics), or any of a variety of other electronic systems. The electronic system 100 includes a set of battery cells 102. The battery cells may be of any suitable type. In examples, the battery cells may be of the same or different types. The set of battery cells 102 includes battery cells 104, 106, 108, and 110. As numeral 112 indicates, further battery cells may be included. The scope of this description is not limited to any specific number of battery cells, and the set of battery cells 102 may include any number of battery cells (e.g., one or more). The battery cells 104, 106, 108, 110, 112 may be coupled in series, as shown. Numerals 114 and 116 indicate the voltage that may be provided by the set of battery cells 102 responsive to the battery cells being coupled in series. Pairs of nodes 118, 120, nodes 120, 122, nodes 122, 124, nodes 124, 126, and nodes 126, 128 couple the battery cells 104, 106, 108, 110, 112 to a multi-cell battery fault indicator IC 130. The IC 130 includes an IC output 132. In operation, the IC 130 monitors the voltages provided by the battery cells in the set of battery cells 102. Comparators in the IC 130 provide a HIGH comparator output signal responsive to corresponding battery cells entering a fault condition. A logical OR gate in the IC 130 provides a HIGH OR gate output signal responsive to a HIGH comparator output signal. The OR gate output signal is provided on the IC output 132. Thus, the IC output 132 is configured to provide a flag or alert signal responsive to a fault condition in one or more of the battery cells in the set of battery cells 102. The IC 130 also includes a logical AND gate. The logical AND gate receives the same inputs as the logical OR gate. The AND gate is not use in the electronic system 100. Rather, the AND gate is a remnant of the testing process that was applied to the IC 130 during manufacture to verify that the IC 130 operates properly. After testing of the IC 130 is complete, the AND gate remains in the IC 130, even as the IC 130 is implemented in the electronic system 100. However, the AND gate is not useful in the electronic system 100, because the AND gate-unlike the OR gate-will not provide an alert signal unless all of the battery cells in the set of battery cells 102 are in fault conditions.

Figure 2:
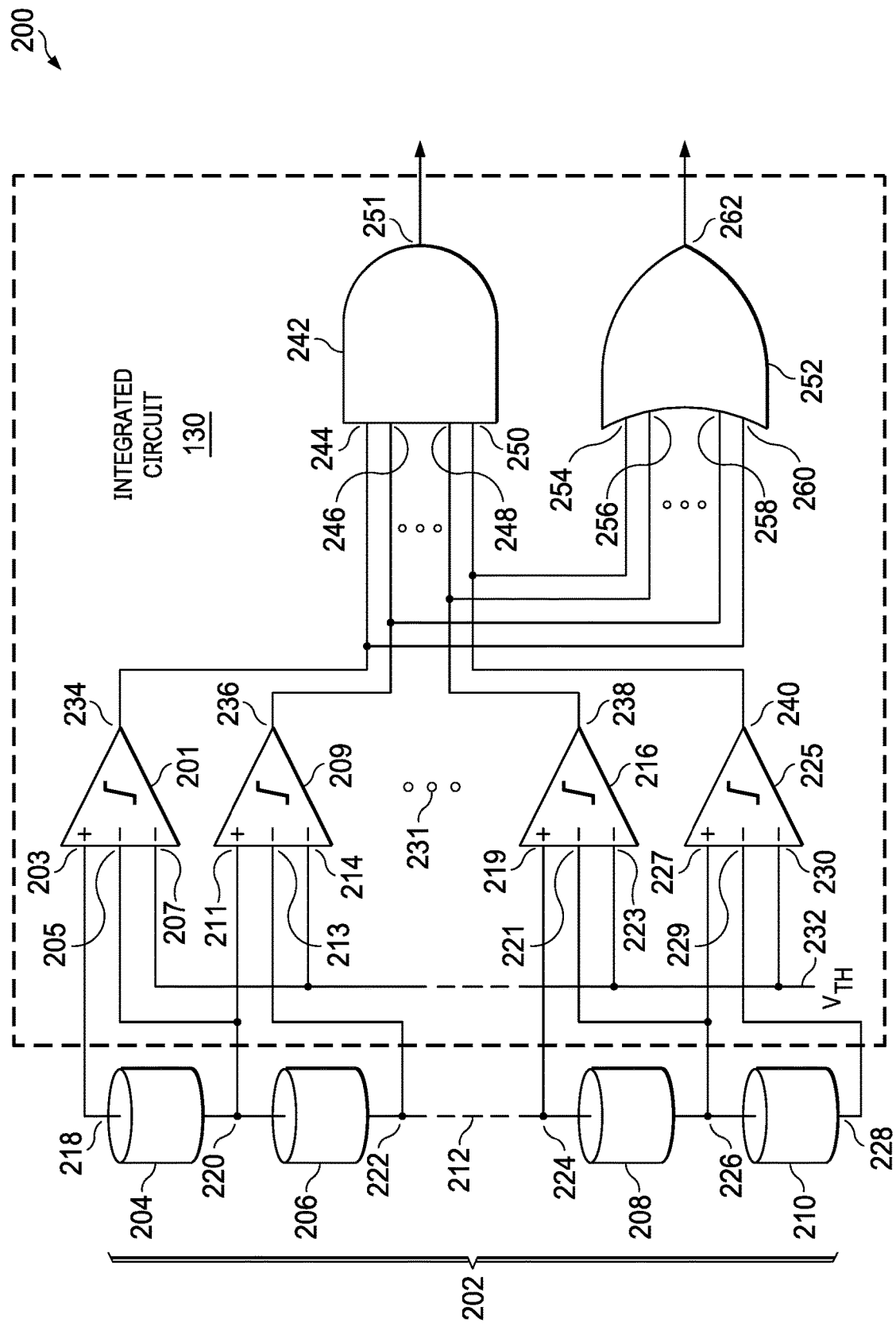
FIG. 2 is a schematic diagram of a multi-cell battery fault indicator IC coupled to a set of battery cells in a testing environment, in accordance with examples.

FIG. 2 is a schematic diagram of the multi-cell battery fault indicator IC 130 in a testing environment 200, in accordance with examples. The testing environment 200 includes a set of battery cells 202. The set of battery cells 202 includes battery cells 204, 206, 208, 210, and any number of battery cells 212. The description provided above for the battery cells in the set of battery cells 102 applies to the battery cells in the set of battery cells 202, and thus is not repeated here. Nodes 218, 220, 222, 224, 226, and 228 couple the battery cells in the set of battery cells 202 to the IC 130, as shown.

Figure 3:
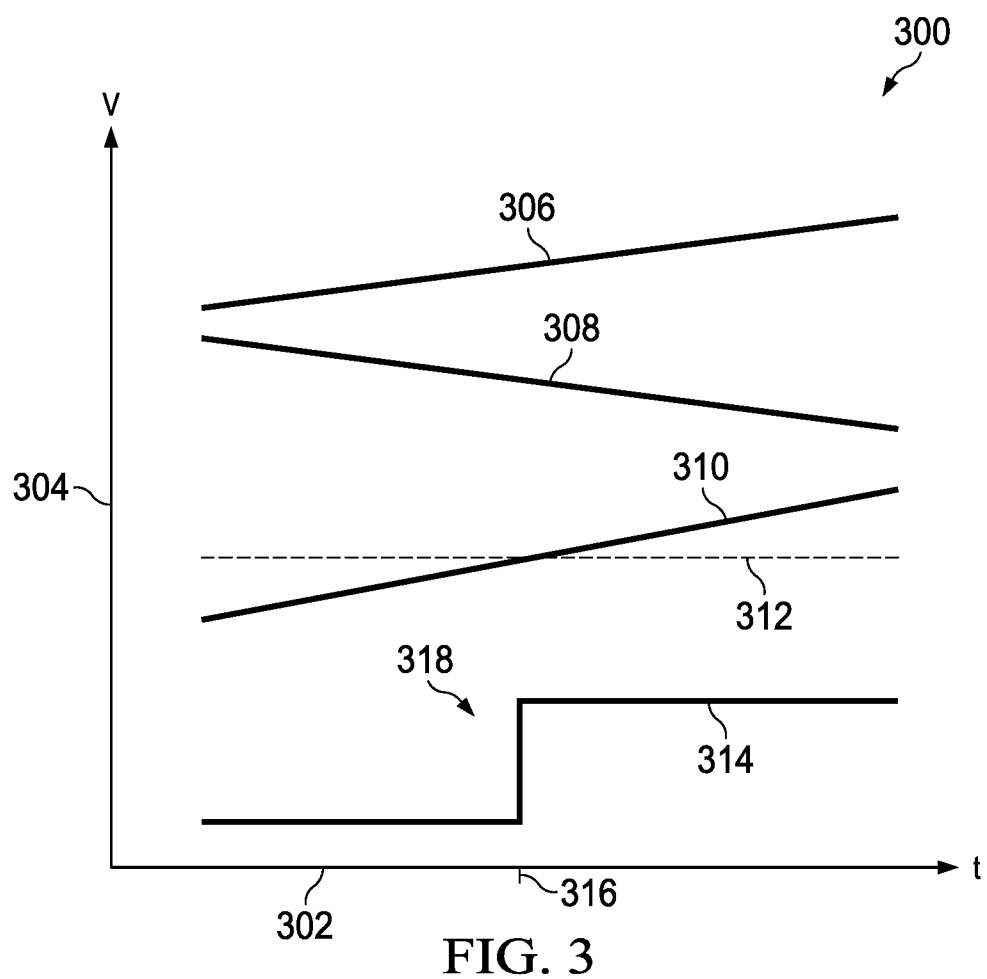
FIG. 3 is a graph showing the operation of a comparator in a multi-cell battery fault indicator IC, in accordance with examples.

The IC 130 may include any suitable number of comparators. For example, the IC 130 includes a number of comparators that matches the number of battery cells in the set of battery cells 202. In examples, the IC 130 may include a comparator 201. The comparator 201 includes a comparator battery cell input 203, a comparator battery cell input 205, and a comparator threshold input 207. The IC 130 may include a comparator 209. The comparator 209 includes a comparator battery cell input 211, a comparator battery cell input 213, and a comparator threshold input 214. The IC 130 may include a comparator 216. The comparator 216 includes a comparator battery cell input 219, a comparator battery cell input 221, and a comparator threshold input 223. The IC 130 may include a comparator 225. The comparator 225 includes a comparator battery cell input 227, a comparator battery cell input 229, and a comparator threshold input 230. A threshold voltage source 232 is coupled to the comparator threshold inputs 207, 214, 223, and 230, and the threshold voltage source 232 provides a threshold voltage to the comparator threshold inputs 207, 214, 223, and 230. The comparator 201 includes a comparator output 234. The comparator 209 includes a comparator output 236. The comparator 216 includes a comparator output 238. The comparator 225 includes a comparator output 240. The IC 130 may include a logical AND gate 242 that is coupled to the comparator outputs 234, 236, 238, and 240 at AND gate inputs 244, 246, 248, and 250, respectively. The AND gate 242 has an AND gate output 251, which in some examples is identical to the IC output 132. The IC 130 may include a logical OR gate 252 that is coupled to the comparator outputs 234, 236, 238, and 240 at OR gate inputs 254, 256, 258, and 260, respectively. The OR gate 252 has an OR gate output 262. Because FIG. 3 shows the operation of the comparators 201, 209, 216, and 225, a description of FIG. 3 is provided prior to describing the operation of IC 130. Numeral 231 indicates that further comparators may be included.

FIG. 3 is a graph 300 showing the operation of a comparator, such as any one of the comparators 201, 209, 216, and 225, in accordance with examples. The graph 300 includes an x-axis 302 representing time, and a y-axis 304 representing voltage. Curve 306 represents a voltage provided to a non-inverting comparator battery cell input (e.g., comparator battery cell input 203), and curve 308 represents a voltage provided to an inverting comparator battery cell input (e.g., comparator battery cell input 205). Curve 310 represents the difference between the curves 306 and 308. Line 312 represents the threshold voltage provided by the threshold voltage source 232. Curve 314 represents an output signal provided on a comparator output of the comparator. As curves 306 and 308 show, the differential between the comparator battery cell inputs may increase (e.g., due to the voltage provided by a corresponding battery cell increasing). Curve 310 demonstrates this increase in differential. The differential between the comparator battery cell inputs may exceed a threshold voltage, as shown by curve 310 crossing the threshold line 312. At this crossing point, which occurs at time 316, the comparator output provides a HIGH signal, as curve 314 shows at rise 318.

Referring again to FIG. 2, the IC 130 may be tested in the testing environment 200 prior to implementation in an electronic device or system. In the testing environment 200, each of the battery cells 204, 206, 208, and 210 is forced into a fault condition or a simulated fault condition by a suitable entity, such as testing equipment. For example, each of the battery cells 204, 206, 208, and 210 may be forced to output a voltage exceeding a particular threshold voltage, such as a threshold voltage provided by threshold voltage source 232. Accordingly, the comparators 201, 209, 216, and 225 should provide HIGH comparator output signals at their respective comparator outputs 234, 236, 238, and 240. Accordingly, the AND gate 242 provides a HIGH output signal at the AND gate output 251. Such a HIGH output signal indicates that all of the comparators 201, 209, 216, and 225 are operating properly, because an AND gate will not provide a HIGH output signal unless all inputs to the AND gate are HIGH. A LOW output signal at the AND gate output 251 indicates that fewer than all of the comparators 201, 209, 216, and 225 produced a HIGH comparator output signal or that the AND gate 242 is defective, and thus the IC 130 should be discarded or repaired. Also, the testing entity may test the OR gate 252 by determining the OR gate output signal provided at the OR gate output 262. If the OR gate output 262 transitions from a LOW OR gate output signal to a HIGH OR gate output signal as one or more of the battery cells is forced into a fault condition, the OR gate 252 is operating properly. Otherwise, the IC 130 should be discarded or repaired. After proper operation of the IC 130 has been verified as described above, the IC 130 may be implemented in an electronic device or system, such as those described above.

Figure 4:
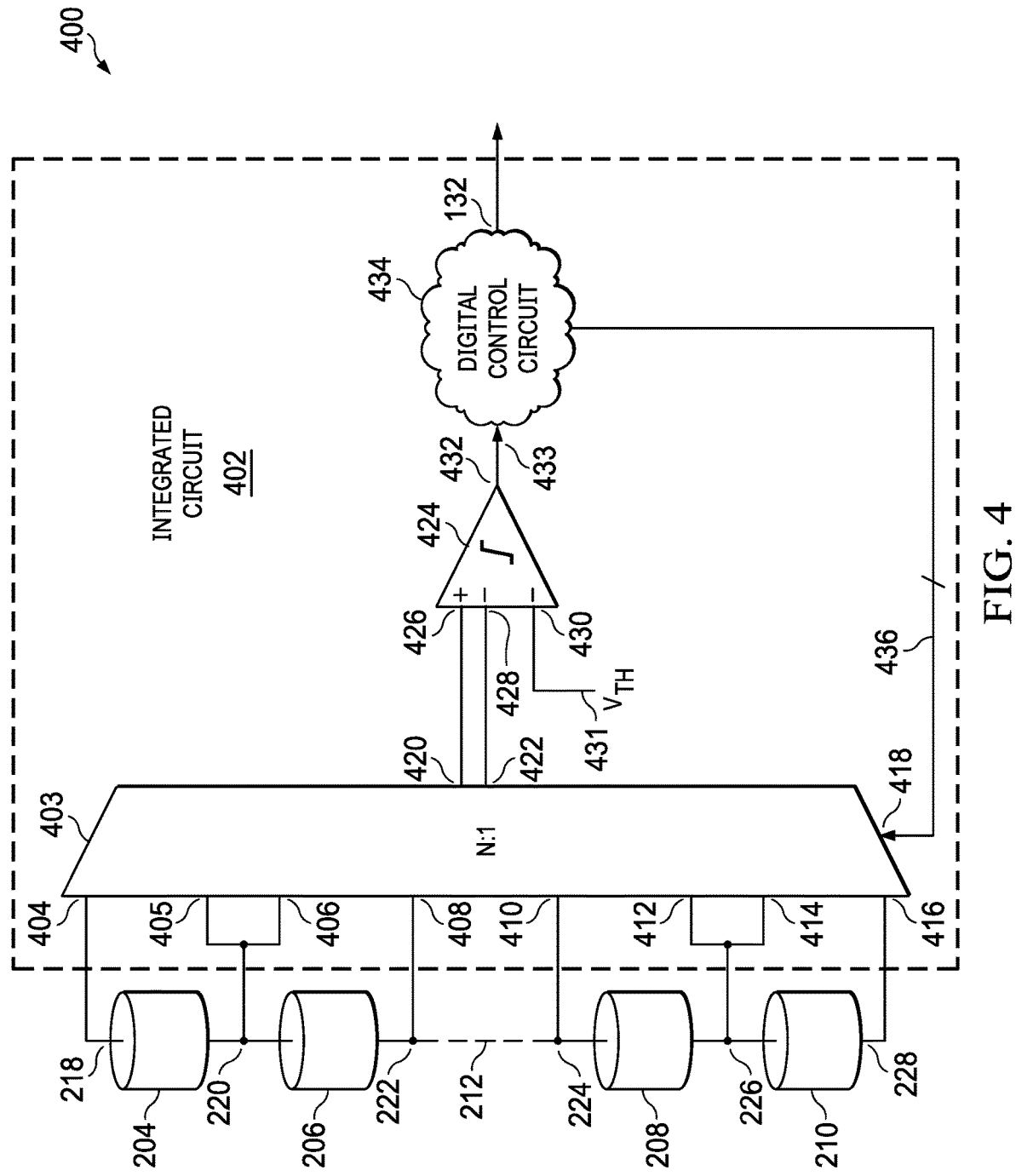
FIG. 4 is a schematic diagram of a multi-cell battery fault indicator IC coupled to a set of battery cells in a testing environment, in accordance with examples.

FIG. 4 is a schematic diagram of a testing environment 400 including a multi-cell battery fault indicator IC 402 coupled to a set of battery cells in a testing configuration, in accordance with examples. The example IC 402 includes a multiplexer (MUX) 403. The MUX 403 includes a pair of MUX inputs 404 and 405, a pair of MUX inputs 406 and 408, a pair of MUX inputs 410 and 412, and a pair of MUX inputs 414 and 416. The MUX 403 also includes a MUX control input 418. The MUX 403 includes MUX outputs 420 and 422, with the differential between the MUX outputs 420 and 422 forming a MUX output signal. In some examples, each of the MUX outputs 420 and 422 provides a MUX output signal. In examples, the IC 402 includes a comparator 424. The comparator 424 may include a comparator battery cell input 426 (e.g., non-inverting), a comparator battery cell input 428 (e.g., inverting), a comparator threshold voltage input 430, and a comparator output 432. The comparator output 432 is configured to provide a comparator output signal 433. The IC 402 may include a digital control circuit (DCC) 434, which is configured to provide a MUX control signal 436 and the IC output 132.

Still referring to FIG. 4, the MUX input 404 is coupled to node 218. The MUX input 405 is coupled to node 220. MUX input 406 is coupled to node 220. MUX input 408 is coupled to node 222. MUX input 410 is coupled to node 224. MUX input 412 is coupled to node 226. MUX input 414 is coupled to node 226. MUX input 416 is coupled to node 228. MUX control input 418 is coupled to the DCC 434. MUX output 420 is coupled to comparator battery cell input 426. MUX output 422 is coupled to comparator battery cell input 428. A threshold voltage source 431 is coupled to the comparator threshold voltage input 430. The comparator output 432 is coupled to the DCC 434.

The IC 402 may be tested in the testing environment 400 prior to implementation in an electronic device or system. In the testing environment 400, each of the battery cells 204, 206, 208, and 210 is forced into a fault condition or a simulated fault condition by a suitable entity, such as testing equipment. For example, each of the battery cells 204, 206, 208, and 210 may be forced to output a voltage exceeding a particular threshold voltage, such as a threshold voltage provided by threshold voltage source 431. The DCC 434 controls the MUX 403 using MUX control signal 436 to allow different pairs of MUX input signals to be provided at the MUX outputs 420 and 422. For example, the DCC 434 may control the MUX 403 to cause the voltage provided to the MUX inputs 404 and 405 to be provided by the MUX outputs 420 and 422. In another example, the DCC 434 may control the MUX 403 to cause the voltage provided to the MUX inputs 410 and 412 to be provided by the MUX outputs 420 and 422. In this way, the voltage provided by each of the battery cells 204, 206, 208, and 210 may be individually provided by the MUX outputs 420 and 422, depending on the MUX control signal 436. In examples, the DCC 434 selects each pair of MUX inputs and stores the resulting comparator output signal 433. Thus, for instance, because there are four pairs of MUX inputs, one for each battery cell, the DCC 434 contains at least four storage units (e.g., registers), each storage unit configured to store a different comparator output signal 433. The DCC 434 may include one or more logic gates, such as an AND gate and/or an OR gate, having inputs that are configured to receive the stored comparator output signals 433 and to provide logic gate outputs in a manner similar to that described above with respect to FIG. 2. In this way, the operation of the IC 402 is tested in the testing environment 400 prior to implementation of the IC 402 in an electronic device or system. If the IC 402 fails such testing, the IC 402 may be repaired or discarded. As with the structure of FIG. 2, in the testing environment 400, any number of battery cells, multiplexers, and comparators may be included, and in any suitable configuration. An example DCC 434 is now described with reference to FIG. 5.

Figure 5:
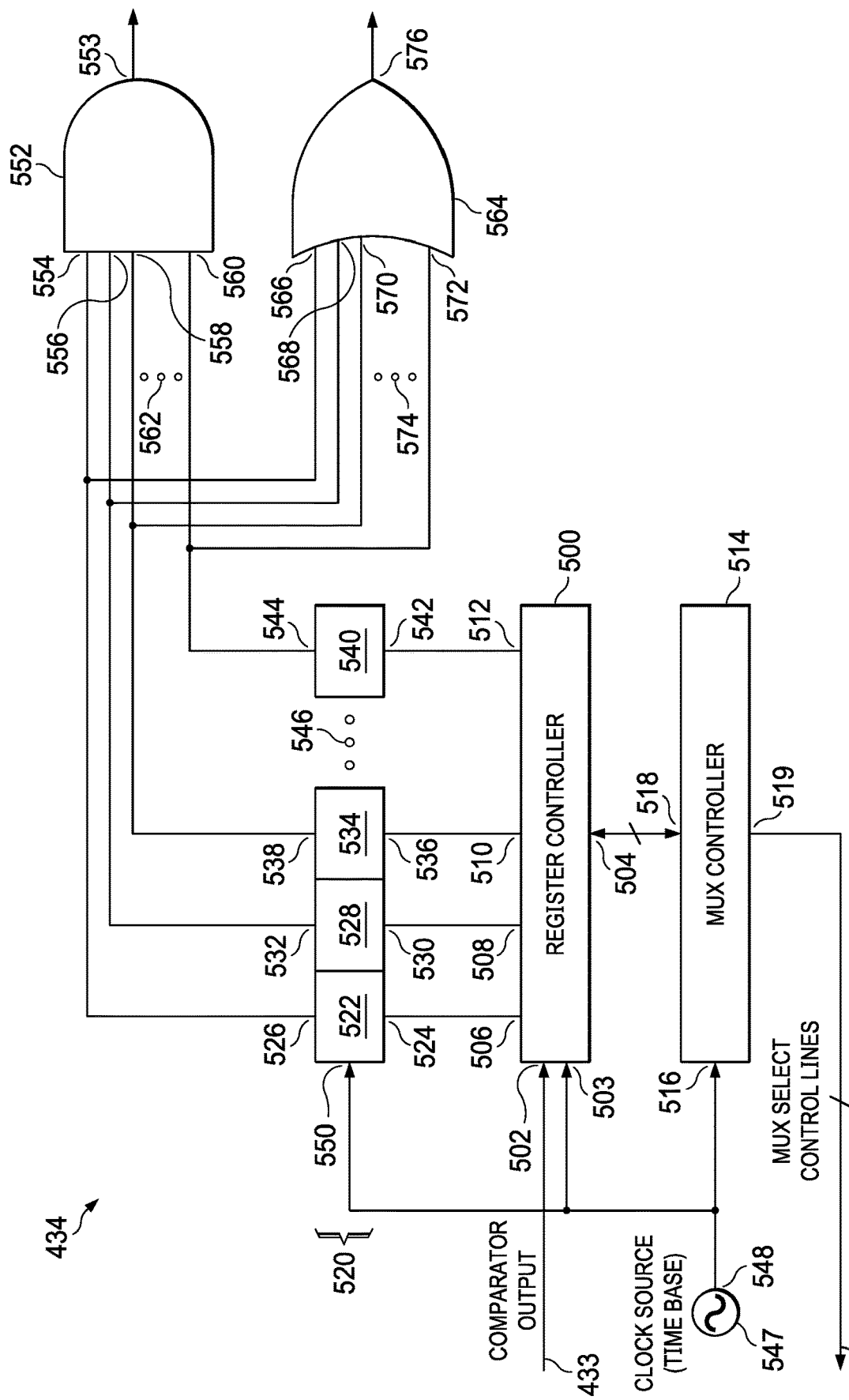
FIG. 5 is a schematic diagram of a portion of a multi-cell battery fault indicator IC, in accordance with examples.

FIG. 5 is a schematic diagram of the DCC 434, in accordance with various examples. The DCC 434 includes a register controller 500. The register controller 500 may include a register controller input 502, a register controller clock input 503, a register controller input/output (I/O) 504, and register controller outputs 506, 508, 510, . . . , 512. The register controller 500 may include any suitable number of register outputs. The DCC 434 may include a MUX controller 514. The MUX controller 514 may include a MUX controller clock input 516, a MUX controller I/O 518, and a MUX controller output 519. The DCC 434 may include a set of registers 520. The set of registers 520 may include a register 522 having a register input 524 and a register output 526; a register 528 having a register input 530 and a register output 532; a register 534 having a register input 536 and a register output 538; a register 540 having a register input 542 and a register output 544; and one or more registers 546, each register 546 having its own input and output. All register inputs may be coupled to respective register controller outputs, as shown.

In examples, the DCC 434 includes a clock source 547 having a clock source output 548 that operates the register controller 500, the MUX controller 514, and the set of registers 520 synchronously. Each register in the set of registers 520 includes a register clock input 550. The DCC 434 may include a logic AND gate 552. The AND gate 552 may have an AND gate output 553 (which may be the same as the IC output 132) and AND gate inputs 554, 556, 558, and 560. The AND gate 552 may include further AND gate inputs 562. The DCC 434 may also include an OR gate 564 having OR gate inputs 566, 568, 570, and 572. The OR gate may include further OR gate inputs 574. The OR gate has an OR gate output 576, which may be the same as the IC output 132.

The register controller outputs 506, 508, 510, . . . , 512 are coupled to respective register inputs 524, 530, 536, . . . , 542, as described above. The register controller input 502 is coupled to the comparator output 432 (FIG. 4) and is configured to receive the comparator output signal 433. The register controller clock input 503 is coupled to the clock source output 548. The register controller I/O 504 is coupled to the MUX controller I/O 518. The MUX controller clock input 516 is coupled to the clock source output 548. The MUX controller output 519 is coupled to the MUX control input 418 (FIG. 4). The register clock input 550 is coupled to the clock source output 548. The register outputs 526, 532, 538, . . . , 544 are coupled to AND gate inputs 554, 556, 558, . . . , 560, respectively. The OR gate inputs 566, 568, 570, 572, and 574 are coupled to the AND gate inputs 554, 556, 558, 560, and 562, respectively.

Referring to FIGS. 4 and 5, the operation of the IC 402 is now described. In operation, the MUX controller 514 controls the MUX 403 (FIG. 4) by way of the MUX controller output 519 as described above. In examples, the MUX controller 514 selects a different pair of MUX inputs in an alternating manner. In examples, the MUX controller 514 changes the MUX control signal 436 synchronously with the clock source 547. The comparator 424 provides a comparator output signal 433 to the register controller 500 depending on the MUX control signal 436. The register controller 500 stores the received comparator output signal 433 to one of the registers of the DCC 434, with the act of storage to a register and the selection of the register for storage based on the clock signal provided by the clock source 547. The MUX controller 514 and the register controller 500 may communicate with each other as may be appropriate. For example, the MUX controller 514 may indicate to the register controller 500 that the MUX control signal 436 is being changed. In an example, the register controller 500 may indicate to the MUX controller 514 that a received comparator output signal 433 has been stored to a register. After the comparator output signals 433 corresponding to the different battery cells 204, 206, 208, and 210 have been stored to the registers of the DCC 434, the AND gate output signal provided by the AND gate output 553 and the OR gate output signal provided by the OR gate output 576 are determined. If the AND gate output 553 is HIGH, and the OR gate output 576 is HIGH, the IC 402 is operating properly. Conversely, if the AND gate output 553 is LOW, or if the OR gate output 576 is LOW, the IC 402 is not operating properly and may be either repaired or discarded. In the event that fewer than all of the battery cells are being tested, at least some of the battery cell voltages received by the AND gate 552 will be low, and thus the AND gate output 553 in these situations may be disregarded.

In this description, the term "couple" may cover connections, communications or signal paths that enable a functional relationship consistent with this description. For example, if device A provides a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

While certain components may be described herein as being of a particular process technology, these components may be exchanged for components of other process technologies. Circuits described herein are reconfigurable to include the replaced components to provide functionality at least partially similar to functionality available prior to the component replacement.

Unless otherwise stated, "about," "approximately," or "substantially" preceding a value means+/−10 percent of the stated value. Modifications are possible in the described examples, and other examples are possible, within the scope of the claims.

What is claimed is:

1. An Apparatus, comprising:
   a multiplexer (MUX) adapted to be coupled to a set of battery cells and configured to provide a voltage of a different battery cell in the set of battery cells based on a MUX control signal;
   a comparator coupled to the MUX and configured to compare a MUX output signal to a threshold voltage to provide a comparator output signal; and
   a digital control circuit configured to provide the MUX control signal to the MUX, to store the comparator output signal, and to use a logic AND gate to provide an AND gate output signal based on the stored comparator output signal.

2. The Apparatus of claim 1, wherein the digital control circuit is configured to use a logic OR gate to provide an OR gate output signal based on the stored comparator output signal.

3. The Apparatus of claim 1, wherein the digital control circuit includes a register controller configured to store the comparator output signal to a register.

4. The Apparatus of claim 3, wherein the digital control circuit includes a MUX controller configured to control the MUX to enable the MUX to provide the voltage.

5. The Apparatus of claim 4, wherein the digital control circuit is configured to use a clock signal to synchronize the MUX controller, the register controller, and the register.

6. The Apparatus of claim 1, wherein the digital control circuit includes a set of registers, each of register in the set of registers configured to store a different comparator output signal provided by the comparator.

7. The Apparatus of claim 6, wherein the digital control circuit is configured to perform an AND operation using the AND gate on the different comparator output signals stored in the set of registers.

8. The Apparatus of claim 1, wherein the comparator has a comparator output, a pair of comparator battery cell inputs, and a comparator threshold input, the pair of comparator battery cell inputs coupled to a pair of MUX outputs, the comparator threshold input adapted to be coupled to a threshold voltage source.

9. The Apparatus of claim 8, wherein the digital control circuit includes a register controller coupled to the comparator output.

10. A system, comprising:
    a first battery cell;
    a second battery cell coupled to the first battery cell; and an integrated circuit (IC) coupled to the first and second battery cells, the IC comprising:

a multiplexer (MUX) having a pair of MUX outputs, multiple MUX battery cell inputs, and a MUX control input, the multiple MUX battery cell inputs coupled to each of the first and second battery cells;

a comparator having a comparator output, a pair of comparator battery cell inputs, and a comparator threshold input, the pair of comparator battery cell inputs coupled to the pair of MUX outputs, the comparator threshold input adapted to be coupled to a threshold voltage source; and a digital control circuit comprising:

a set of registers, each register in the set of registers having a register output, a register input, and a register clock input, the register clock inputs adapted to be coupled to a clock source;

a register controller having a set of register controller outputs, a register controller input, and a register controller clock input, each register controller output in the set of register controller outputs coupled to a different data register input, the register controller input coupled to the comparator output, the register controller clock input adapted to be coupled to the clock source;

a MUX controller having a MUX controller output and MUX controller clock input, the MUX controller output coupled to the MUX control input, the MUX controller clock input adapted to be coupled to the clock source; and a logic AND gate having an AND gate output and a set of AND gate inputs, each AND gate input in the set of AND gate inputs coupled to a different register output.

11. The system of claim 10, wherein the digital control circuit includes a logical OR gate having an OR gate output and a set of OR gate inputs, each OR gate input in the set of OR gate inputs coupled to a different AND gate input in the set of AND gate inputs.

12. The system of claim 10, wherein the register controller is configured to store a comparator output signal provided by the comparator output to a register in the set of registers.

13. The system of claim 12, wherein the MUX controller is configured to control the MUX to enable the MUX to provide a voltage of the first battery cell.

14. The system of claim 13, wherein the digital control circuit is configured to use a clock signal to synchronize the MUX controller, the register controller, and the register.

15. The system of claim 10, wherein each register in the set of registers is configured to store a different comparator output signal provided by the comparator.

16. The system of claim 15, wherein the digital control circuit is configured to perform an AND operation using the AND gate on the different comparator output signals stored in the set of registers.

* * * * *